(12) United States Patent
Song et al.

(10) Patent No.: US 6,989,312 B2
(45) Date of Patent: Jan. 24, 2006

(54) METHOD FOR FABRICATING SEMICONDUCTOR OPTICAL DEVICE

(75) Inventors: Hyun Woo Song, Daejeon-Shi (KR); Won Seok Han, Daejeon-Shi (KR); Jong Hee Kim, Daejeon-Shi (KR); Young Gu Ju, Daejeon-Shi (KR); O Kyun Kwon, Daejeon-Shi (KR); Sang Hee Park, Daejeon-Shi (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 0 days.

(21) Appl. No.: 10/800,680

(22) Filed: Mar. 16, 2004

(65) Prior Publication Data

US 2005/0118741 A1 Jun. 2, 2005

(30) Foreign Application Priority Data

Nov. 28, 2003 (KR) ............. 10-2003-0085359

(51) Int. Cl.
*H01L 21/20* (2006.01)
(52) U.S. Cl. ............... 438/390; 438/746; 438/39; 438/47; 438/22; 438/51; 438/751
(58) Field of Classification Search ............... 438/390, 438/746, 39–47, 22, 751, 51
See application file for complete search history.

(56) References Cited

U.S. PATENT DOCUMENTS

| | | | |
|---|---|---|---|
| 5,045,499 A * | 9/1991 | Nishizawa et al. ......... 405/179 |
| 5,068,868 A | 11/1991 | Deppe et al. | |
| 5,711,811 A | 1/1998 | Suntola et al. | |
| 5,739,945 A * | 4/1998 | Tayebati ............ 359/291 |
| 6,121,068 A | 9/2000 | Ramdani et al. | |
| 6,324,192 B1 * | 11/2001 | Tayebati ............ 372/20 |
| 6,555,891 B1 * | 4/2003 | Furukawa et al. ......... 257/505 |
| 6,577,785 B1 * | 6/2003 | Spahn et al. ............ 385/22 |
| 6,713,356 B1 * | 3/2004 | Skotnicki et al. ......... 438/285 |
| 2003/0128733 A1 * | 7/2003 | Tan et al. ............ 372/96 |
| 2004/0099857 A1 * | 5/2004 | Song et al. ............ 257/12 |

FOREIGN PATENT DOCUMENTS

JP 11-307863 11/1999

(Continued)

OTHER PUBLICATIONS

Chao-Kun Lin, et al; "*Electrically pumped 1.3 VCSELs with InP/air-gap DBRs*"; CLEO '02 Lasers and Electro-optics, 2002.; pp. 755-757.

(Continued)

*Primary Examiner*—B. William Baumeister
*Assistant Examiner*—Igwe U. Anya
(74) *Attorney, Agent, or Firm*—Mayer, Brown, Rowe & Maw LLP

(57) ABSTRACT

Provided is a method for fabricating a semiconductor optical device that can be used as a reflecting semiconductor mirror or an optical filter, in which two or more types of semiconductor layers having different etch rates are alternately stacked, at least one type of semiconductor layers is selectively etched to form an air-gap structure, and an oxide or a nitride having a good heat transfer property is deposited so that the air gap is buried, whereby it is possible to effectively implement the semiconductor reflector or the optical filter having a high reflectance in a small period because of the large index contrast between the oxide or the nitride buried in the air gap and the semiconductor layer.

8 Claims, 7 Drawing Sheets

FOREIGN PATENT DOCUMENTS

JP         2001135850 A    *    5/2001

OTHER PUBLICATIONS

Chao-Kun Lin, et al; *"High temperature continuous-wave operation of 1.3-1.55 um VCSELs with InP/air-gap DBRs"*; IEEE 18th. International Semiconductor Laser Confrerence 2002; pp. 145-146.

I. Gagnes, et al; *"MOCVD InP/AlGaInAs distributed Bragg reflector for 1.55um VCSELs"*; Electronics Letters Apr. 12th, 2001, vol. 37, No. 8; pp. 500-501.

J.-H.Shin, et al; *"CW Operation and Threshold Characteristics of All-Monolithic InAlGaAs 1.55-um VCSELs Grown by MOCVD"*; IEEE Photonics Technology Letters, vol. 14, No. 8; Aug. 2002; pp. 1031-1033.

K. Streubel, et al; "1.26um vertical cavity laser with two InP/air-gap reflectors"; Electronics Letters Jul. 18th, 1996, vol. 32, No. 15; pp. 1369-1370.

Hyun-Eoi Shin, et al; *"High-finesse AlxOy/AlGaAs nonabsorbing optical cavity"*; Applied Physics Letters; Vol. 72, No. 18; May 4, 1998; pp. 2205-2207.

Sun Jin Yun, et al; "Dependence of atomic layer-deposited $Al_2O_3$ films characteristics on growth temperature and Al precursors of Al $(CH_3)_3$ and $AlCl_3$"; J. Vac. Sci. Technol. A 15 (6), Nov/Dec 1997; pp. 2993-2997.

* cited by examiner

METHOD FOR FABRICATING SEMICONDUCTOR OPTICAL DEVICE

BACKGROUND OF THE INVENTION

1. Field of the Invention

The present invention relates to a semiconductor optical device applied to a technical field such as an optical communication device, a surface emitting laser or the like and, more specifically, to a method for fabricating a semiconductor optical device that can be used as a semiconductor reflector or an optical filter.

2. Description of the Related Art

Semiconductor optical devices have been applied to a variety of fields because of its simple high-density integration and long life span. The semiconductor optical device having a wavelength region for communication (i.e., 1.2 $\mu$m to 1.8 $\mu$m) is mostly formed on an InP or GaAs substrate. It is possible to obtain the semiconductor optical device that is available for a reflector or an optical filter, in case where materials each having high and low refractive indexes are alternately stacked by each proper thickness. The aforementioned semiconductor reflector or optical filter may be applied to active and passive semiconductor devices. In particular, a highly reflective reflector would be required for implementing a surface emitting laser, and thus various techniques have been applied thereto.

A semiconductor reflector according to a prior art includes an InP/InAlAs reflector, an InAlGaAs/InAlAs reflector, an InAlGaAsSb/InAlAsSb reflector, and the like, which are obtained by lattice-matched growth on an InP substrate [References 1, 5 and 6]. An InP/air-gap reflector has been developed, which can be obtained by lattice matched growth on an InP substrate and selective etch [References 3, 4, 7 and 11]. A dielectric reflector obtained by a deposition method [Reference 2], an Al(Ga)As/GaAs reflector grown on a GaAs substrate [Reference 12], a reflector obtained by wet-oxidizing an Al(Ga)As layer on the GaAs substrate [Reference 8], or the like can be attached to a gain medium grown on the InP substrate using wafer-to-wafer fusion method in order to fabricate an active device, such as a surface emitting laser.

[Reference 1]
Dennis G. Deppe, et al., Vertical cavity surface emitting lasers with electrically conducting mirrors, U.S. Pat. No. 5,068,868 (Nov. 26, 1991), AT&T Bell Laboratory.

[Reference 2]
Jamal Ramdani, et al., Long-wavelength light emitting vertical cavity surface emitting laser and method of fabrication, U.S. Pat. No. 6,121,068 (Sep. 19, 2000), Motorola, Inc.

[Reference 3]
Chao-Kun Lin, et al., Electrically pumped 1.3 $\mu$m VCSELs with InP/air-gap DBRs., Conference on Lasers and Electro-optics 2002, CPDB10-1, pp. 755~757, 2002.

[Reference 4]
Chao-Kun Lin, et al., High temperature continuous-wave operation of 1.3–1.55 $\mu$m VCSELs with InP/air-gap DBRs, IEEE 18th International Semiconductor Laser Conference, ThA6, pp. 145~146, 2002.

[Reference 5]
I. Sagnes, et al., MOCVD InP/AlGaInAs distributed Bragg reflector for 1.55 $\mu$m VCSELs, Electronics Letters, Vol. 37 (8), pp. 500~501, 2001.

[Reference 6]
J. - H. Shin, et al., CW operation and threshold characteristics of all-monolithic InAlGaAs 1.55 $\mu$m VCSELs grown by MOCVD, IEEE Photonics Technology Letters, Vol. 14 (8), pp. 1031~1033, 2002.

[Reference 7]
K. Streubel, et al., 1.26 $\mu$m vertical cavity laser with two InP/air-gap reflectors, Vol. 32 (15), pp. 1369~1370, 1996.

[Reference 8]
H.- E. Shin, et al., High-finesse AlxOy/AlGaAs non-absorbing optical cavity, Applied Physics Letters, Vol. 72 (18), 1998.

[Reference 9]
Sun Jin Yun, et al., Dependence of atomic layer-deposited $Al_2O_3$ films characteristics on growth temperature and Al precursors of Al $(CH_3)_3$ and $AlCl_3$., J. Vac. Sci. and Tech., vol 15 (6), pp. 2993~2997, 1997.

[Reference 10]
Tuomo Suntola, et al., Method and equipment for growing thin films, U.S. Pat. No. 5,711,811 (Jan. 27, 1998).

[Reference 11]
Uchiyama Seiji, "surface light emitting semiconductor laser device and method for manufacturing thereof", Japanese Patent Laid-Open No. H11-307863, Furukawa Electric Co. LTD.

[Reference 12]
Iwai Norihiro, et al., "surface emitting semiconductor laser device and its manufacture", Japanese Patent Laid-Open No. H12-012962, Furukawa Electric Co. LTD.

However, the above-mentioned conventional semiconductor reflectors have the following advantages and disadvantages.

First, the InP/InAlAs reflector, the InAlGaAs/InAlAs reflector, the InAlGaAsSb/InAlAsSb reflector, and etc., which are obtained by the lattice-matched growth on the InP substrate, have an advantage that they are conductive reflectors [Reference 1] through which a current can be flowed. On the other hand, they have disadvantages that a growth thickness thereof is large and thickness adjustment or growth is difficult.

The InP/air-gap reflector, which can be obtained by the lattice matched growth on the InP substrate and the selective etch, has advantages that it has a small thickness and is easily fabricated while it has a disadvantage that it is mechanically weak and unstable.

In the case of dielectric reflector obtained by the deposition method and the Al(Ga)As/GaAs reflector grown on the GaAs substrate, and etc., a wafer-to-wafer fusion technique must be applied thereto. It is known that this technique has a disadvantage in mass production.

Further, in the case of the reflector obtained by growing crystalline thin films on the GaAs substrate and wet-oxidizing an Al(Ga)As layer of the grown crystal thin film, there is a problem of poor reliability due to the strain generated at the time of the wet-oxidizing.

Therefore, it is required to develop a semiconductor reflector and an optical filter that are able to overcome the disadvantages of the conventional semiconductor reflectors, and are more reliable in structure and easily fabricated.

SUMMARY OF THE INVENTION

The present invention is directed to a method for fabricating a semiconductor optical device, which can be used in a wavelength region for optical communication and be fabricated by simple processes, and has mechanical reliability and mass productivity.

One aspect of the present invention is to provide a method for fabricating a semiconductor optical device, comprising the steps of: alternately stacking two or more types of semiconductor layers having different etch rates on a semiconductor substrate; patterning the stacked semiconductor layers using a given mask; forming a mesa structure to etch selectively at least one type of semiconductor layers resulting in an air-gap structure, wherein the mesa structure is composed by the rest of the semiconductor layers; and depositing a material having a good heat transfer property so that the air gap is buried.

In a preferred embodiment of the present invention, the stacked semiconductor layers are patterned so that widths of device regions thereof are narrower than those of supporting regions at both sides of the device regions. Alternatively, the stacked semiconductor layers are patterned so that a width of a device region thereof is narrower than that of a supporting region at one side of the device region.

Here, the semiconductor layers are materials that can be grown by a crystalline growth on the semiconductor substrate. The material having the good heat transfer property is an oxide, a nitride, or a mixture thereof. Preferably, it may be one of $Al_2O_3$, ZnO, MgO, $TiO_2$, $Ta_2O_5$, $ZrO_2$, $HfO_2$, $SiO_2$, $Si_3N_4$, AlN, and AlON, or a combination thereof, and it can be deposited by an atomic layer deposition method. In addition, the semiconductor optical device is a reflector or an optical filter.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1A:
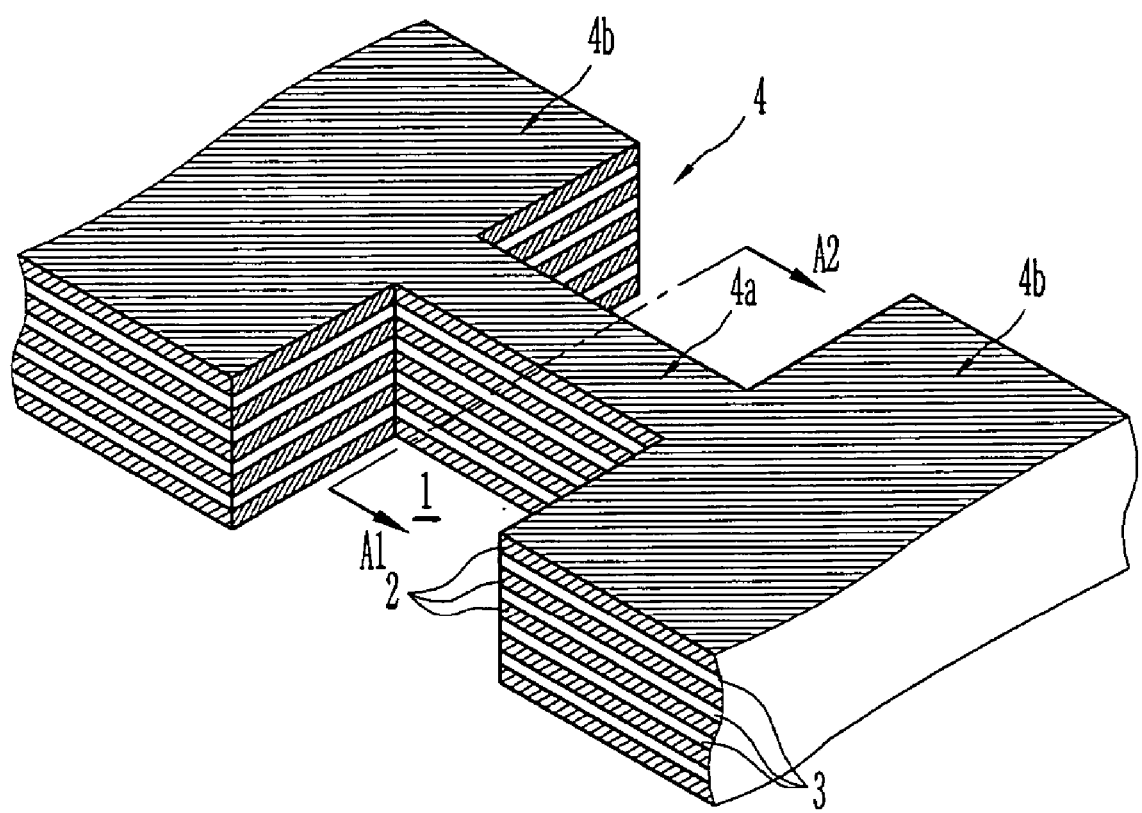
FIGS. 1A and 1B are perspective views for explaining a method for fabricating a semiconductor optical device according to a preferred embodiment of the present invention.

The foregoing and other objects and new features of the present invention will be apparent from the description of this disclosure and the accompanying drawings.

Hereinafter, preferred embodiments of the present invention will be described in detail with reference to the accompanying drawings. The embodiments of the present invention, however, may be changed into several other forms, and the scope of the present invention should not be construed to be limited to the following embodiments. The embodiments of the present invention are intended to more completely explain the present invention to those skilled in the art. Accordingly, the shapes of elements or the like shown in figures are exaggerated to emphasize distinct explanation, and elements indicated by like reference numerals in the figures mean like elements. Further, when it is described that any layer is present 'on' another layer or a semiconductor substrate, it means that the layer may be present in direct contact with another layer or the semiconductor substrate. Alternatively, a third layer may be interposed between them.

Figure 1B:
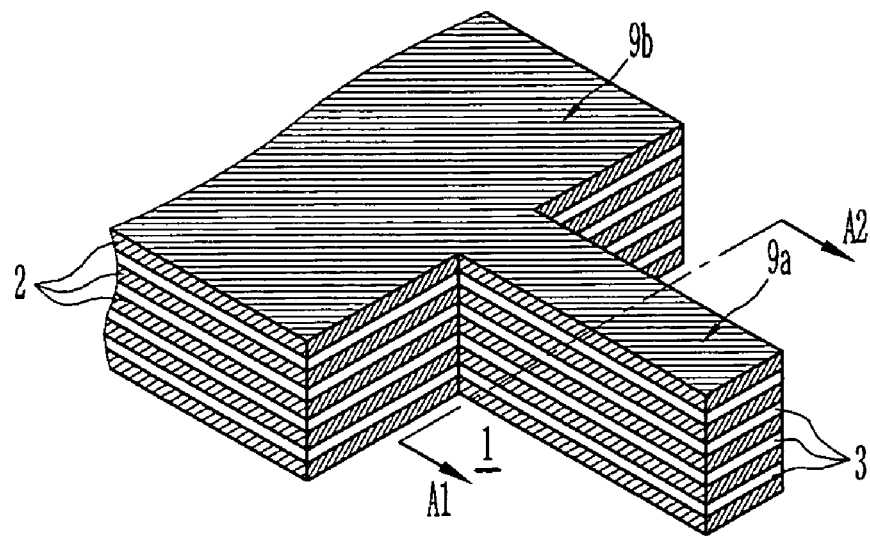
Figure 1C:
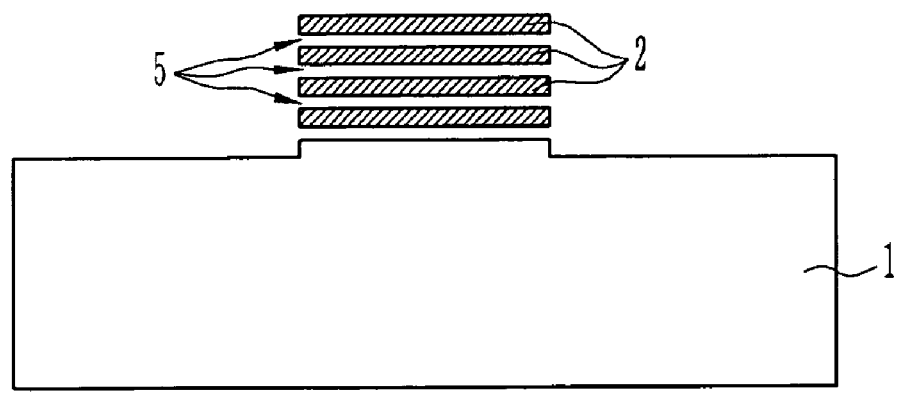
FIG. 1C is a cross-sectional view taken along the line A1–A2 of FIGS. 1A and 1B.
Figure 2:
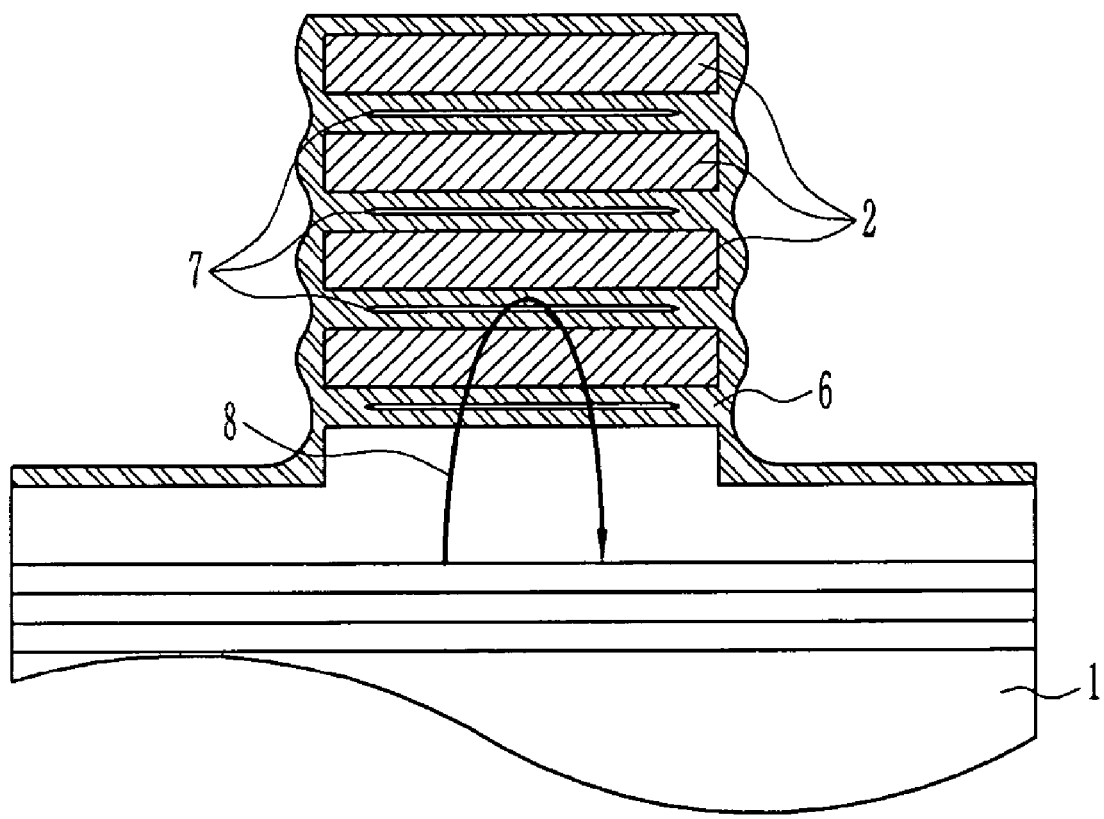
FIG. 2 is a cross-sectional view of a semiconductor optical device according to a preferred embodiment of the present invention.

FIGS. 1A and 1B are perspective views for explaining a method for fabricating a semiconductor optical device according to a preferred embodiment of the present invention, FIG. 1C is a cross-sectional view taken along the line A1–A2 of FIGS. 1A and 1B, and FIG. 2 is a cross-sectional view of a semiconductor optical device according to an embodiment of the present invention.

III–V group semiconductor layers 2 and 3 with different etch rates are alternately and iteratively stacked on an InP semiconductor substrate 1. At least one type of semiconductor layers 2 or 3 are selectively etched to form an air gap 5 as in FIG. 1C, so that a floated bridge (see FIG. 1A) or cantilever (see FIG. 1B) type of a mesa structure 4 or 9 including the air gap 5 is formed. At this time, it is noted that the mesa structure 4 and 9 should not be collapsed. In one effective method for the purpose of this, if the semiconductor layers 2 and 3 are deposited and then patterned so that the widths of device regions 4a and 9a are narrower than those of supporting regions 4b and 9b as in FIGS. 1A and 1B, the remained semiconductor layer 3 in the supporting regions 4b and 9b will support the remained semiconductor layer 2 in the device regions 4a and 9a since the semiconductor layer 3 in the supporting regions 4b and 9b remains in part while the semiconductor layer 3 in the device regions 4a and 9a is completely etched by lateral selective etching. Besides, the above-mentioned stable mesa structure 4 may be formed using etching methods with high selectivity for the III–V group semiconductor layers or using a method for etching only specific portions of the semiconductor layers with a mask.

The semiconductor layers 2 and 3 may be formed by a metal-organic vapor phase epitaxy method. The materials that can be grown on the InP substrate 1, such as InP, InGaAs, InAlGaAs, InAlAs InGaAsP or the like, may be used. Each of the materials can be subjected to selective etching process having high selectivity by means of wet etching using a citric acid, phosphoric acid or hydrochloric acid system.

Referring to FIG. 2, a material 6 having an excellent heat transfer property is partially or fully filled into the air gap 5 formed by the etching process as shown in FIG. 1C. At this time, voids 7 may be partially contained within the air gap 5 in the process of depositing the material 6. An atomic layer deposition method may be utilized to effectively fill the material 6 into the every air gap 5. At this time, using tri methyl aluminum (TMA) and $H_2O$ as materials enables a dense thin film to be formed with a refractive index of 1.6 to 1.7 at a relatively low temperature of about 200 to 400° C.

For the material 6 having the excellent heat transfer property, an oxide, a nitride, or a mixture thereof may be used. For example, $Al_2O_3$, ZnO, MgO, $TiO_2$, $Ta_2O_5$, $ZrO_2$, $HfO_2$, $SiO_2$, $Si_3N_4$, AlN, AlON, and etc. may be used. Alternatively, a combination thereof may be used. In the case of using an $Al_2O_3$ thin film, it is possible to effectively implement a reflector or an optical filter having a high reflectance even in a small period since it practically has a significantly different refractive index as compared to those of semiconductor layers grown on the InP semiconductor substrate 1, for example, InAlGaAs, InGaAsP, InAlAs, and InGaAs. In addition, a heat-conductive property is very excellent and accordingly a good heat release property is obtained, as compared to the semiconductor layers 2 and 3. When it is applied to an optical device where the heat release property is critical, it is possible to significantly enhance the device property of the optical device. Further, passivation of leakage currents, which may be generated at etched sections, would be possible when it is applied to an optical active device. In the Figure, a reference numeral 8 denotes a passage through which light is incident and reflected.

As a result, it can be implemented in an InP substrate that is generally used for light source devices for communication since the semiconductor layers capable of selectively being etched are applied, and has a mechanically reliable structure and a good heat-conductive property due to the material 6 filled in the air gap 5. As mentioned above, the semiconductor reflector or optical filter, which is mechanically reliable and has a high reflectance, may be applied to optical devices, such as a surface emitting laser, passive optical filter, and etc.

The semiconductor optical device as described above may be used as a semiconductor reflector or optical filter. It can be constructed with a variety of placement and thickness by two or more different semiconductor layers (e.g., 2 or 3) according to the design of the optical filter to be used. The optical device completed by forming basic semiconductor layers and taking the above processes will have designed optical properties, such as transmitting or reflecting wavelengths in a specific region, and the like.

Figure 3:
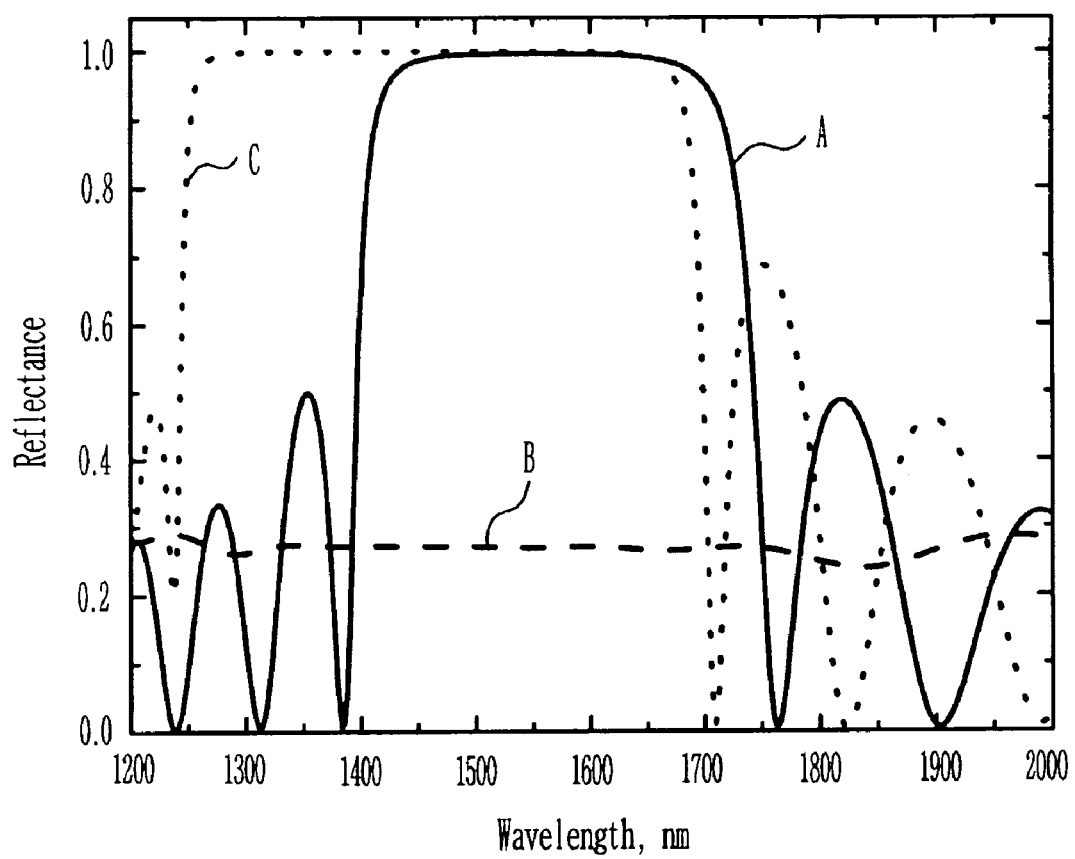
FIG. 3 is a graph illustrating a reflectance property of a semiconductor optical device according to an embodiment of the present invention.

As a detailed example, the reflectance property as indicated by the line A of FIG. 3. can be obtained, in the case of designing a highly reflective reflector at the vicinity of 1.55 $\mu$m in wavelength and fabricating an optical device on the InP substrate using the above-stated processes.

FIG. 3 is a graph illustrating a reflectance property as a change of reflectance versus wavelength, in the semiconductor optical device according to an embodiment of the present invention.

A reflectance spectrum curve (line B) indicates a reflectance measured at the state where the semiconductor layers 2 and 3 having different etch rates have been alternately and iteratively stacked on the InP semiconductor substrate 1 as in FIG. 1A or 1B, a reflectance spectrum curve (line C) indicates a reflectance measured at the state where the air gap 5 has been formed by selectively etching at least one type of semiconductor layers 2 or 3 as in FIG. 1C, and a reflectance spectrum curve (line A) indicates a reflectance measured at the state where an aluminum oxide film (deletion) has been filled in the air gap 5.

Figure 4:
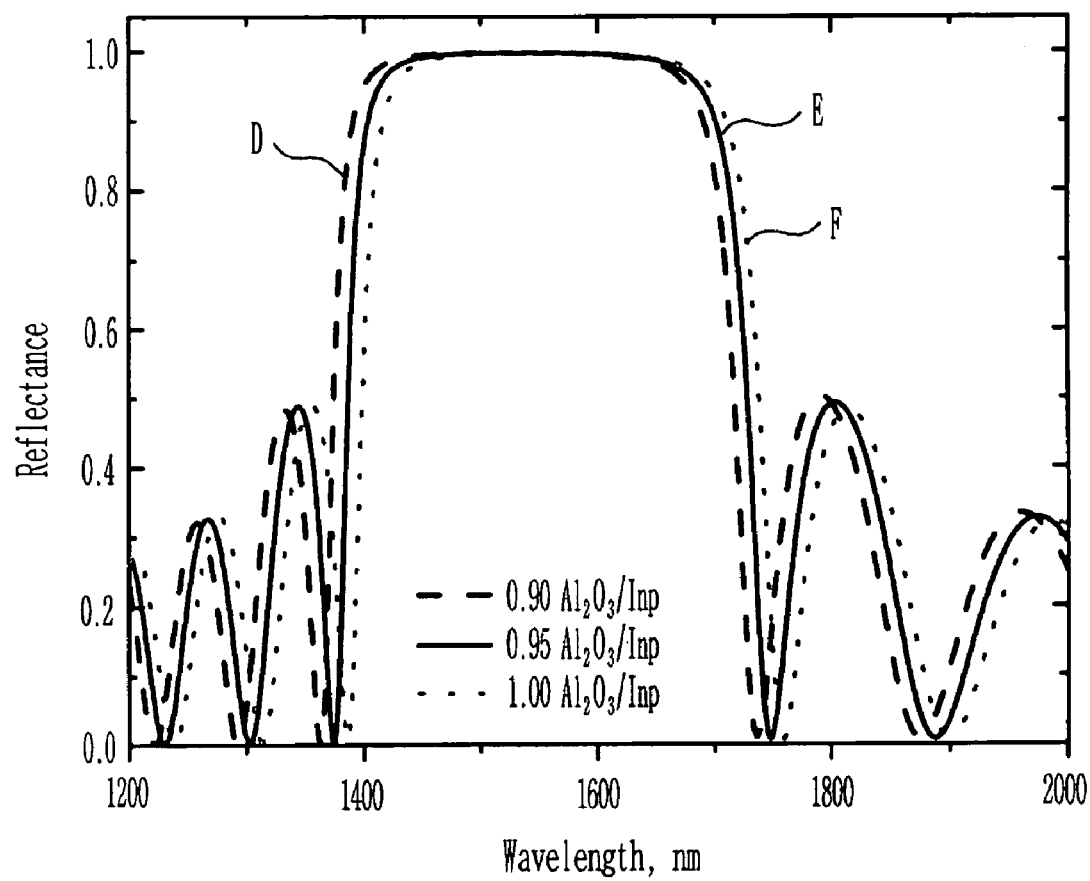
FIG. 4 is a graph illustrating a reflectance spectrum of a semiconductor optical device according to a preferred embodiment of the present invention.

FIG. 4 is a reflectance spectrum of a semiconductor optical device according to a preferred embodiment of the present invention, showing a change in reflectance with a thickness ratio of the voids 7 contained in an aluminum oxide film (deletion) filled in the air gap 5. It shows reflectance, in case where the thickness ratio of the voids 7 within an aluminum oxide film ($Al_2O_3$) is 10% (line D) and 5% (line E), and there is no void (line F).

Figure 5:
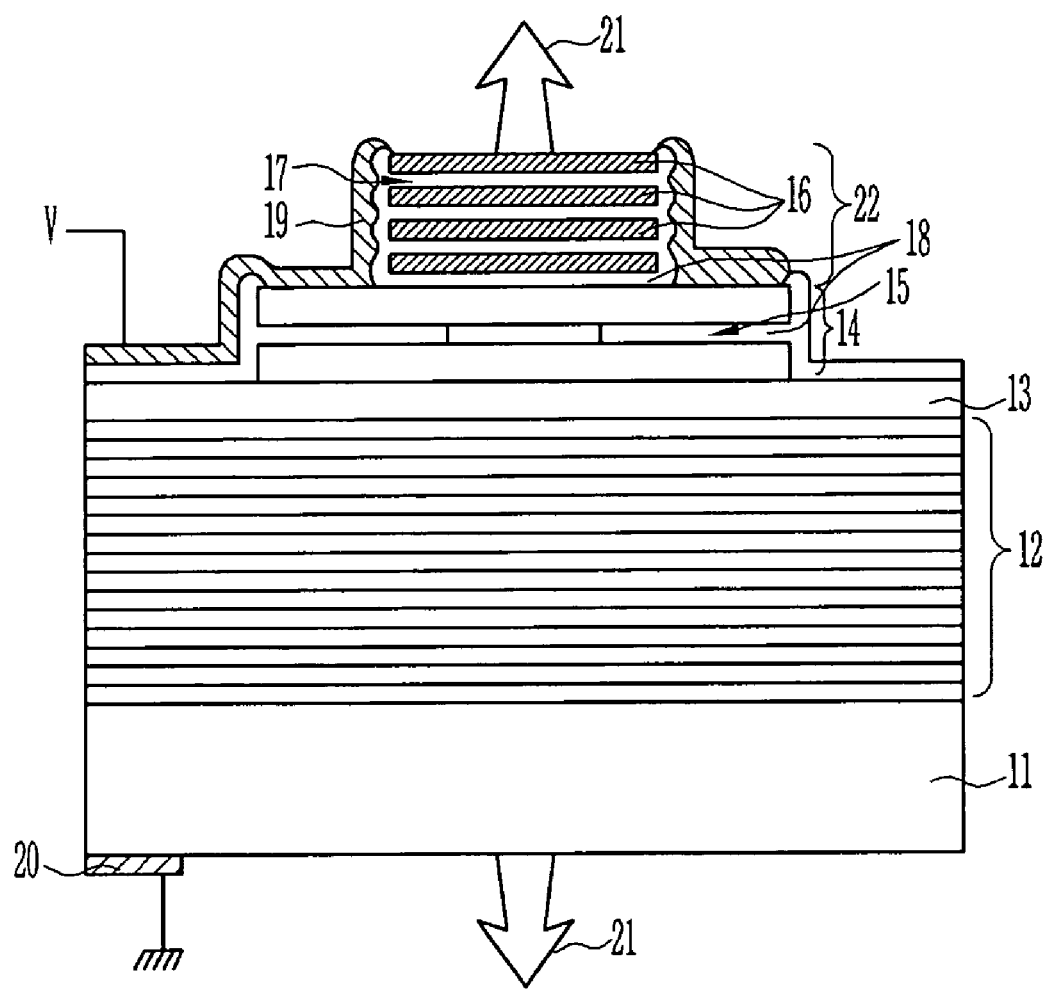
FIG. 5 is a cross-sectional view for explaining an embodiment in which a upper reflector of a surface emitting laser is fabricated by applying a method for fabricating a semiconductor optical device of the present invention.

FIG. 5 is a cross-sectional view for explaining an embodiment in which an upper reflector for a surface-emitting laser is fabricated by applying a method for fabricating a semiconductor optical device of the present invention.

A lower reflector 12, a conductive region 13, and a current confining region 14 are sequentially formed on a semiconductor substrate 11. The current confining region 14 is formed of a multi-layer structure of semiconductor layers having different etch rates. Semiconductor layers 16 having different etch rates are alternately and iteratively stacked on the current confining region 14 and patterned. At least one type of semiconductor layers are selectively etched to form air gaps 15 and 17 in the current confining region 14 and an upper reflector region 22, respectively. A mesa structure having a bridge or cantilever type floated by the air gap 17 is formed. A material 18 having an excellent heat-conductive property is deposited so that the air gaps 15 and 17 are buried, thereby forming a current confining structure in the current confining region 14. The semiconductor layer 16 and the filled air gap 17 form the upper reflector 22 having a high reflectance. Electrodes 19 and 20 are formed on the current confining region 14 and the conductive region 13, or the substrate 11, respectively. A reference numeral 21 in the figure indicates output light.

Figure 6:
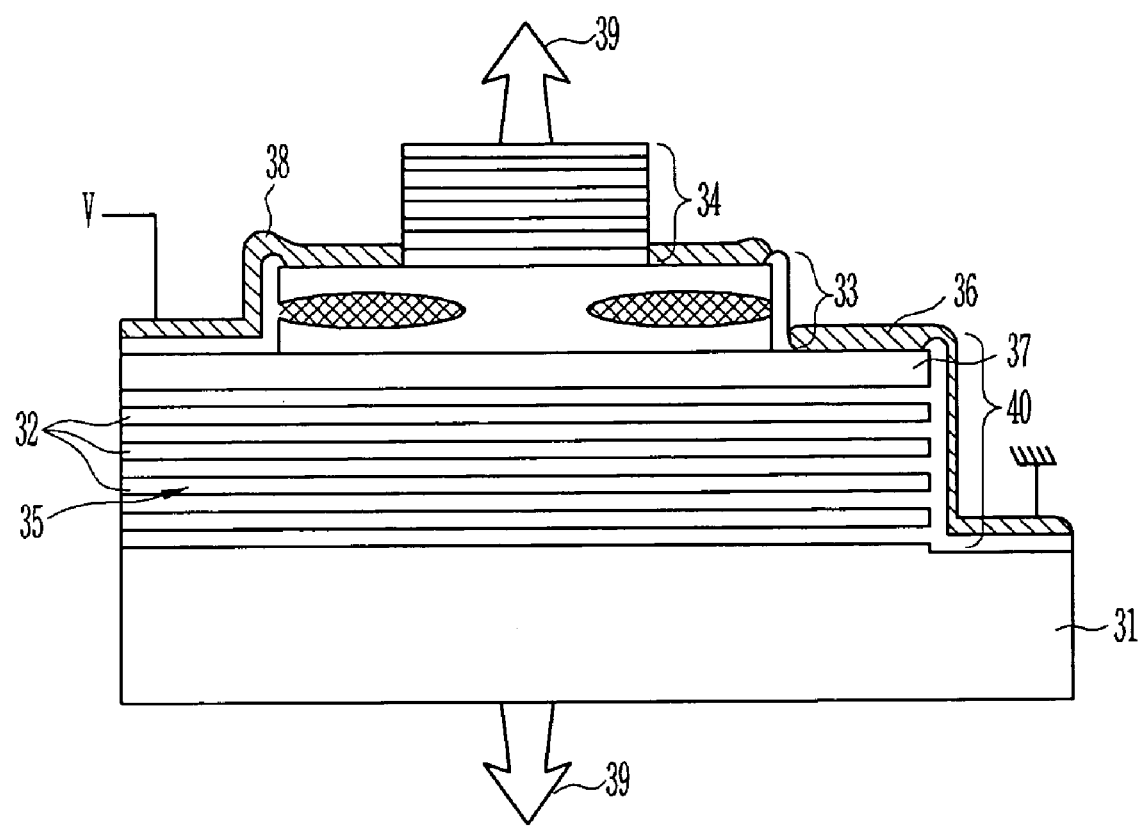
FIG. 6 is a cross-sectional view for explaining an embodiment in which a lower reflector of a surface emitting laser is fabricated by applying a method for fabricating a semiconductor optical device of the present invention.

FIG. 6 is a cross-sectional view for explaining an embodiment in which a lower reflector for a surface emitting laser is fabricated by applying a method for fabricating a semiconductor optical device of the present invention.

A lower reflector region 40, a conductive region 37, a current confining region 33 and an upper reflector 34 are sequentially formed on a semiconductor substrate 31. The lower reflector region 40 is formed of a multi-layer structure of semiconductor layers having different etch rates.

The reflecting semiconductor mirror 34, the current confining region 33, the conductive region 37 and the lower reflector region 40 are patterned to form a lower reflector, and the mesa structure is made by applying the present invention. At least one type of semiconductor layers is selectively etched so that an air gap 35 is formed in the lower reflector region 40. The lower reflector is formed in the lower region 40 of the semiconductor reflector, by depositing a material 32 having an excellent heat-conductive property to bury the air gap 35 partially or fully. Electrodes 36 and 38 are formed on the current confining region 33 and the conductive region 37, respectively. A reference numeral 39 in the figure indicates output light.

As stated above, the method for fabricating the semiconductor optical device according to the present invention can be applied to manufacture the upper reflector in the upper reflector region 22 or the lower reflector of the lower reflector region 40 in the surface emitting laser shown in FIG. 5 or 6. The upper reflector and the lower reflector may be simultaneously fabricated in accordance with the present invention.

As described above, according to the present invention, semiconductor layers for a semiconductor reflector or an optical filter are stacked and then selectively etched to form an air gap, and one layer or several layers of a material having a good heat transfer property are deposited on an entire surface of the semiconductor layer so that the air gap is buried. Accordingly, it is possible to implement a semiconductor optical device having mechanical stability, excellent heat-conductive property and ensured reliability.

The semiconductor optical device proposed by the present invention can be applied to a semiconductor reflector, an optical filter technical field, an optical communication device technical field, a surface emitting type light source device, a passive optical device, a semiconductor optical amplifier device, and so on.

Although the present invention have been described in detail with reference to preferred embodiments thereof, it is not limited to the above embodiments, and several modifications thereof may be made by those skilled in the art without departing from the technical spirit of the present invention.

What is claimed is:

1. A method for fabricating a semiconductor optical device, comprising the steps of:
   a. alternately stacking two or more types of semiconductor layers having different etch rates on a semiconductor substrate;
   b. patterning the stacked semiconductor layers using a given mask;
   c. forming a mesa structure to etch selectively at least one type of semiconductor layers resulting in an air-gap structure, wherein the mesa structure is composed by the rest of the semiconductor layers; and
   d. depositing a material having a good heat transfer property so that the air gap is buried.

2. The method according to claim 1, wherein the semiconductor layers stacked in the step b are patterned so that widths of device regions thereof are narrower than those of supporting regions at both sides of the device regions.

3. The method according to claim 1, wherein the semiconductor layers stacked in the step b are patterned so that a width of a device region thereof is narrower than that of a supporting region at one side of the device region.

4. The method according to claim 1, wherein the semiconductor layers are materials that can be grown by a crystalline growth on the semiconductor substrate.

5. The method according to claim 1, wherein the material having the good heat transfer property is an oxide, a nitride, or a mixture thereof.

6. The method according to claim 5, wherein the material having the good heat transfer property is one of $Al_2O_3$, ZnO, MgO, $TiO_2$, $Ta_2O_5$, $ZrO_2$, $HfO_2$, $SiO_2$, $Si_3N_4$, AlN, and AlON, or a combination thereof.

7. The method according to claim 5, wherein the material having the good heat transfer property is deposited by an atomic layer deposition method.

8. The method according to claim 1, wherein the semiconductor optical device is a reflector or an optical filter.

* * * * *